United States Patent [19]
Chiang

[11] Patent Number: 5,942,907
[45] Date of Patent: Aug. 24, 1999

[54] METHOD AND APPARATUS FOR TESTING DIES

[75] Inventor: Cheng-Lien Chiang, Taipei, Taiwan

[73] Assignee: Industrial Technology Research Institute, Hsinchu, Taiwan

[21] Appl. No.: 08/852,470

[22] Filed: May 7, 1997

[51] Int. Cl.$^6$ .............................. G01R 31/02; G01R 31/26
[52] U.S. Cl. ........................... 324/762; 324/757; 324/760
[58] Field of Search .................................. 324/754, 757, 324/758, 760, 762, 765

[56] References Cited

U.S. PATENT DOCUMENTS

| | | | |
|---|---|---|---|
| 5,087,877 | 2/1992 | Frentz et al. | 324/760 |
| 5,656,941 | 8/1997 | Bishop et al. | 324/754 |
| 5,731,709 | 3/1998 | Pastore et al. | 324/760 |
| 5,786,701 | 7/1998 | Pedder | 324/754 |
| 5,848,465 | 12/1998 | Hino et al. | 324/757 X |

*Primary Examiner*—Glenn W. Brown
*Attorney, Agent, or Firm*—Tung & Associates

[57] ABSTRACT

In accordance with the present invention, a test board for connecting a bare die to a leadframe for testing the die is provided. The test board has a conducting surface on a bottom portion of the board that is adapted to engage and electrically connect to a lead finger in the leadframe. A tape automated bonding tape which has a conductive lead and a first and a second conductive bump are provided where the first conductive bump is situated on an upper surface of the lead and the second conductive bump is situated on a bottom surface of the lead. The first and second conductive bumps establish an electrical communication between the bumps throughout the conductive lead. The first conductive bump is also connected to the conducting surface of the board and the second bump is adapted to engage in I/O pad so that the bare die may be tested through the leadframe.

20 Claims, 3 Drawing Sheets

METHOD AND APPARATUS FOR TESTING DIES

FIELD OF THE INVENTION

The present invention generally relates to a leadframe and a test fixture that are used to perform tests on an integrated circuit die and more particularly, to a leadframe and a test fixture that are used for performing know good die (KGD), know good set (KGS) and know good module (KGM) tests on an integrated circuit device.

BACKGROUND OF THE INVENTION

In the fabrication process of integrated circuit chips, certain tests, for example, know good die (KGD), know good set (KGS) and know good module (KGM) tests, need to be conducted on a particular die. Most of the conventional methods require the use of a die-attach paddle and thus a permanent assembly of a heat sink to the die-attach paddle. The die-attach paddle must be precisely formed by a photolithography process and an etching process. The die-attach paddle also presents an additional layer of heat insulation which impedes the thermal conductance between the IC chip and the heat sink. Moreover, all the conventional methods require a permanent attachment of a heat sink to a leadframe which makes the testing of an IC chip impossible after it is attached to the heat sink. The capability of testing an IC chip without permanently attaching the chip to a leadframe is very desirable in the fabrication process of IC devices.

In the conventional IC chip fabrication technology, the chips are die-sawed from a wafer one at a time. These chips are called bare chips since they have not been encapsulated (or protected) in plastic packages. The bare chips can be easily damaged by dust, moisture, radiation and temperature variations in the environment. The bare chips can also be damaged during handling due to their extremely small size. To avoid damages to the circuits on the chips, the bare chips can not be stacked during handling and must be picked-up with extreme care. The performance of a KGD test on the bare chips is therefore almost impossible. It is desirable to provide a means for moving the chips without incurring damages during the testing process.

In the conventional fabrication process, a layer of an adhesive tape is first attached to the back of a wafer before the die-sawing process. The bare chips are still attached to the adhesive tape after the die-sawing process. Any potential damages to the chips by falling off the wafer after separation can thus be avoided. After the separation, the bare chips are transferred to the die-attach paddles on leadframes by vacuum means. Any necessary test on the bare chips must therefore be conducted when the chips are still attached to the wafer (a so-called wafer level test) before the separation. The questionable chips are marked by ink and then separated from the wafer. The drawback of this testing method is that there is no guarantee that the bare chips are still good after separation by die-sawing. It is therefore advantageous to provide a method of testing a bare chip immediately after its separation from a wafer and its transfer to a die-attach paddle. Of course, this would require that a die-attach paddle to be independent from a leadframe.

It is therefore an object of the present invention to provide a method and apparatus for detachably mounting a heat sink to a leadframe such that the heat sink, after having an IC die attached, can be detached from the leadframe for testing of the die.

It is a further object of the present invention to provide a method and apparatus for detachably mounting a heat sink to a leadframe and then mounting an IC die to the heat sink such that the IC die and the heat sink can be detached from the leadframe for testing.

SUMMARY OF THE INVENTION

In accordance with the present invention, a test board for connecting a bare die to a leadframe for testing the die is provided. The test board has a conducting surface on a bottom portion of the board which is adapted to engage and electrically connect to a lead finger in the leadframe. A tape automated bonding tape which has a conductive lead and a first and second conductive bump is provided where the first conductive bump is situated on an upper surface of the lead and the second conductive bump is situated on a bottom surface of the lead. The first and second conductive bumps establish an electrical communication between the bumps throughout the conductive lead. The first conductive bump is also connected to the conducting surface of the board and the second bump is adapted to engage an I/O pad so that the bare die may be tested through the leadframe.

In another aspect of the present invention, an apparatus for testing a bare die is provided where a leadframe holding plate is used for fixing a leadframe to lead fingers which are extended away from the leadframe. A testing board is provided for holding the fixture in a fixed position on the leadframe holding plate. The holding plate is adapted for holding a test board and making X, Y and Z plane position adjustments of the board. The test board has a conducting surface on a bottom surface adapted to engage and electrically connect to the lead fingers of the leadframe and to a heat sink having a bare die mounted by adhesive means and a peripheral region situated juxtaposed to the leadframe holding plate. An optical or other means is adapted to engage with the first board holding fixture and to adjust the position of the test board relative to the bare die. A tape automated bonding (TAB) tape is provided.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

Figure 1:
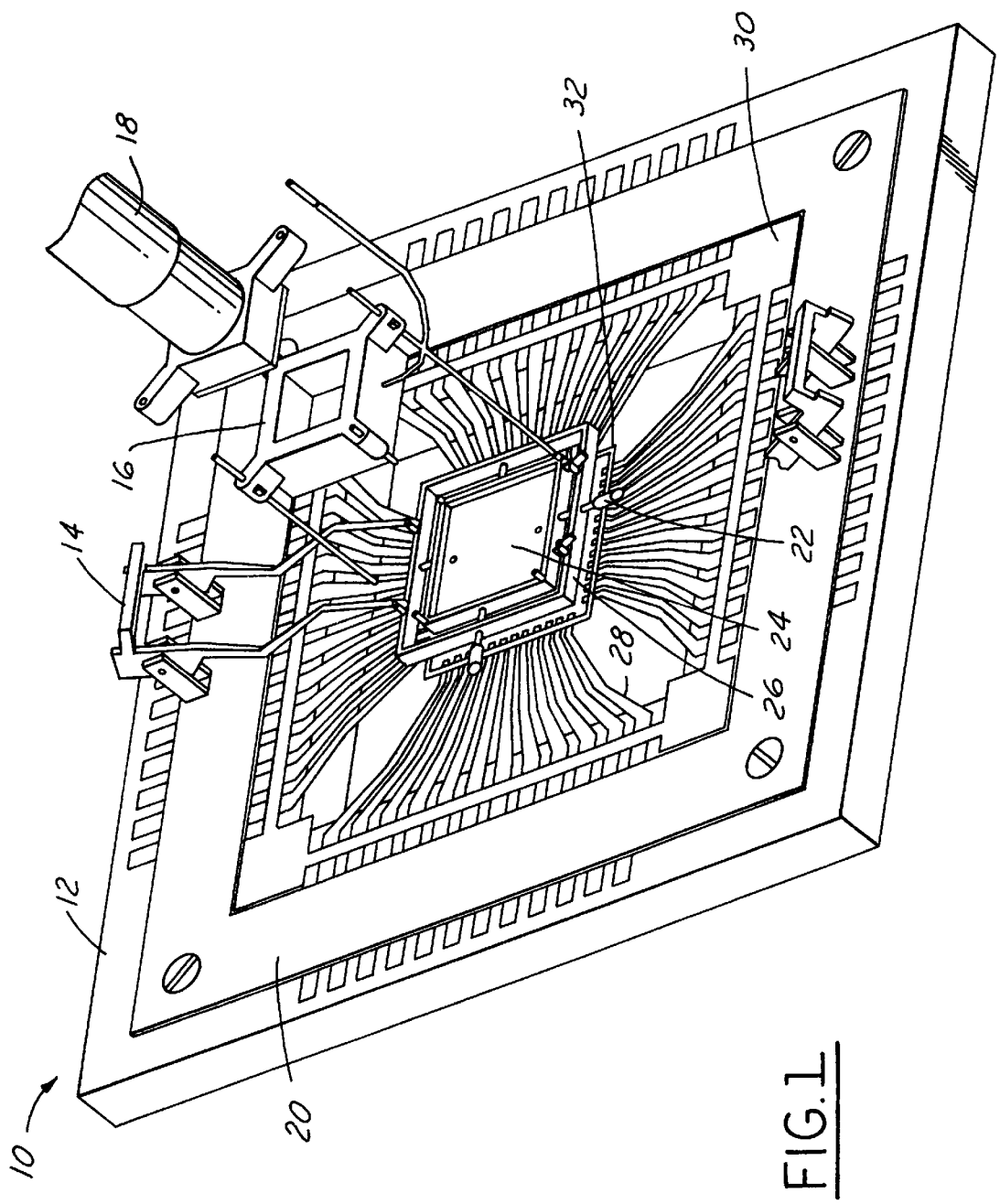
FIG. 1 is a perspective view of the preferred embodiment of the present invention.

Referring to FIG. 1, a device 10 is shown in accordance with the preferred embodiment of the present invention. The device 10 generally comprises a leadframe holding fixture 12, a mechanical support 14, a CCD holding fixture 16, a CCD head 18, a metal holding plate 20, an adjustment screw 22 and a die 24. The die 24 is held in place by a lead holding fixture 26. The metal holding plate 20 is positioned to secure a leadframe 28 onto the leadframe holding fixture 12. A TAB tape 30 surrounds the leadframe 28. A TAB tape 32 surrounds the interior fingers of the leadframe 28. The CCD head 18 and the CCD holding fixture 16 are used to provide alignment of the die 24 after it is positioned and secured on the leadframe 28.

Figure 2:
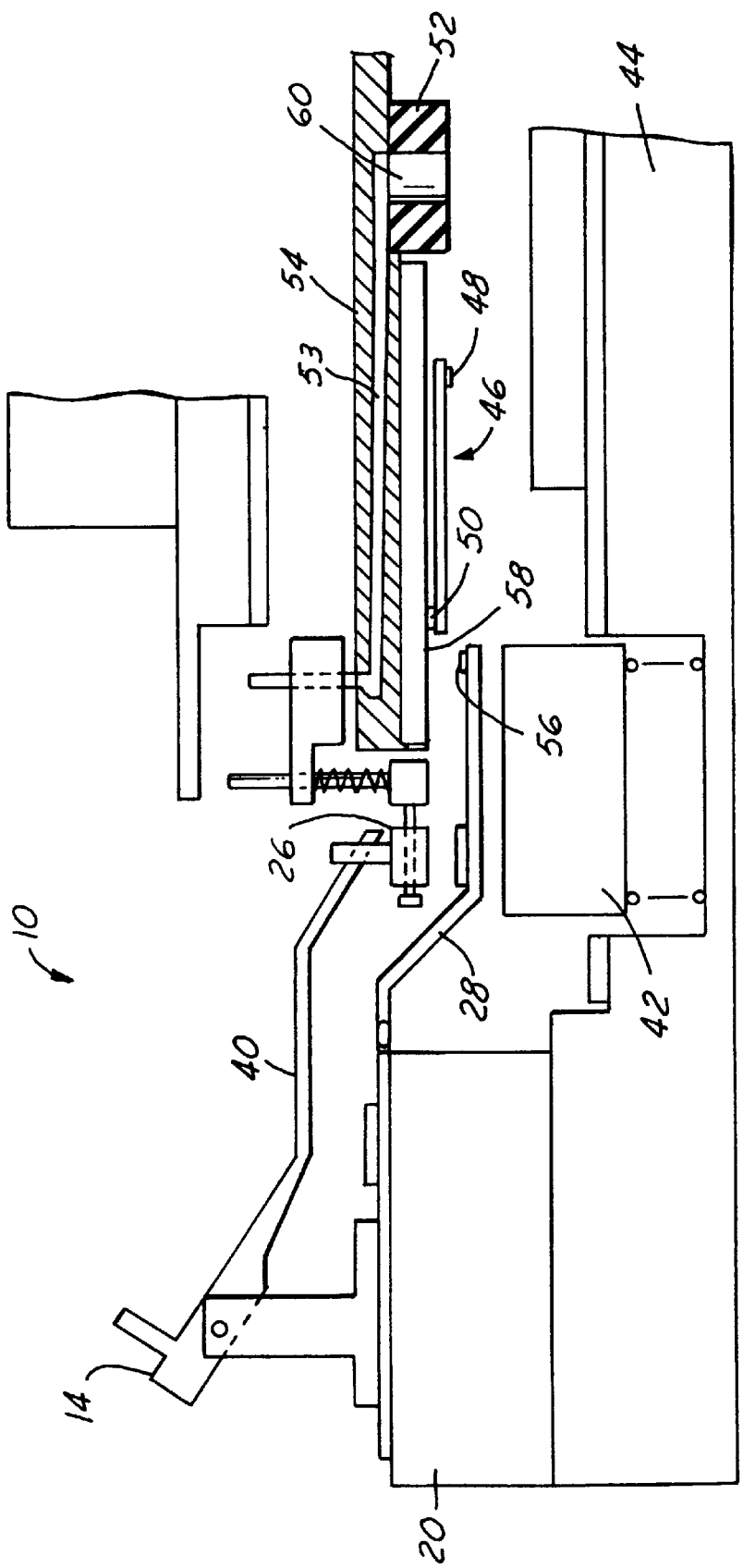
FIG. 2 is a side view of the preferred embodiment of the present invention.

Referring to FIG. 2, a cross-sectional view of the device 10 is shown. The mechanical support 14 is shown to be mounted directly on the metal holding plate 20. An arm 40 of the mechanical support 14 supplies a downward pressure at the lead holding fixture 26 to secure the leadframe 28. The leadframe 28 is shown having an arm that is positioned above a spring loaded locating block 42 which is shown in more detail with respect to FIG. 4. The spring loaded locating block 42 provides a generally upward pressure on the leadframe 28.

It should be noted that there exists a wide selection of stiffness, or spring constants, of the metal used in compression to form the spring loaded locating block 42. The wide latitude in the selection of material properties enables a wide variety of implementations of the spring loaded locating block 42. Parameters such as the metal thickness, the type of metal, and the spring constant of the metal can be selected to fit particular applications.

A heat sink 44 provides a surface to mount the spring loaded locating block 42. Additionally, the die 24 is secured to the heat sink 44 by temporary adhesive means (not shown). The adhesive means used for bonding IC die 24 to the heat sink 44 may be accomplished by using a high thermal conductivity adhesive. One of such suitable adhesives is a thermoset polymer loaded with a conductive metal powder such as silver. However, the adhesive means should be such that the die 24 may be removed after testing.

A TAB 46 is provided having a first conductive solder bump 48 and a second conductive solder bump 50. The first bump 48 is positioned above the die 24 and provides a contact to the die 24 as a test board 54 is moved in a generally downward direction. An elastic block 52 is provided above the TAB tape 46 to provide a flexible means of support. The test board 54 is provided above the elastic block 52 to provide a means to mount the TAB tape 46. An elastic insert 55 is provided above the elastic block 52. The leadframe 28 has an electrically conducting bump 56 located in a position where it touches a conductive portion of the test board 58. This creates an electrical connection between the leadframe 28, through the bump 56, the test board 58, the bump 50, the bump 48 and finally to the die 24. The electrical connection allows for testing of the die 24 without permanently attaching the die 24 to the heat sink 44 or to the leadframe 28. A vacuum tube 60 is provided through the elastic block 52 and an elastic insert 55. The vacuum tube 60 allows for a suction to be created onto the die 24.

The mechanical support 14 comprises fine adjustment mechanism 22 for providing fine adjustment in position in an X, Y or Z direction. Before the die 24 is placed into the XY plane, an alignment coordinate (not shown) is referenced on a transparent glass of a CCD head 18. The alignment coordinate provides a basis to make the XY adjustment to correct for the coordinate intervals that occur when the chip or the substrate is die bonded to the heat sink 44.

Figure 3:
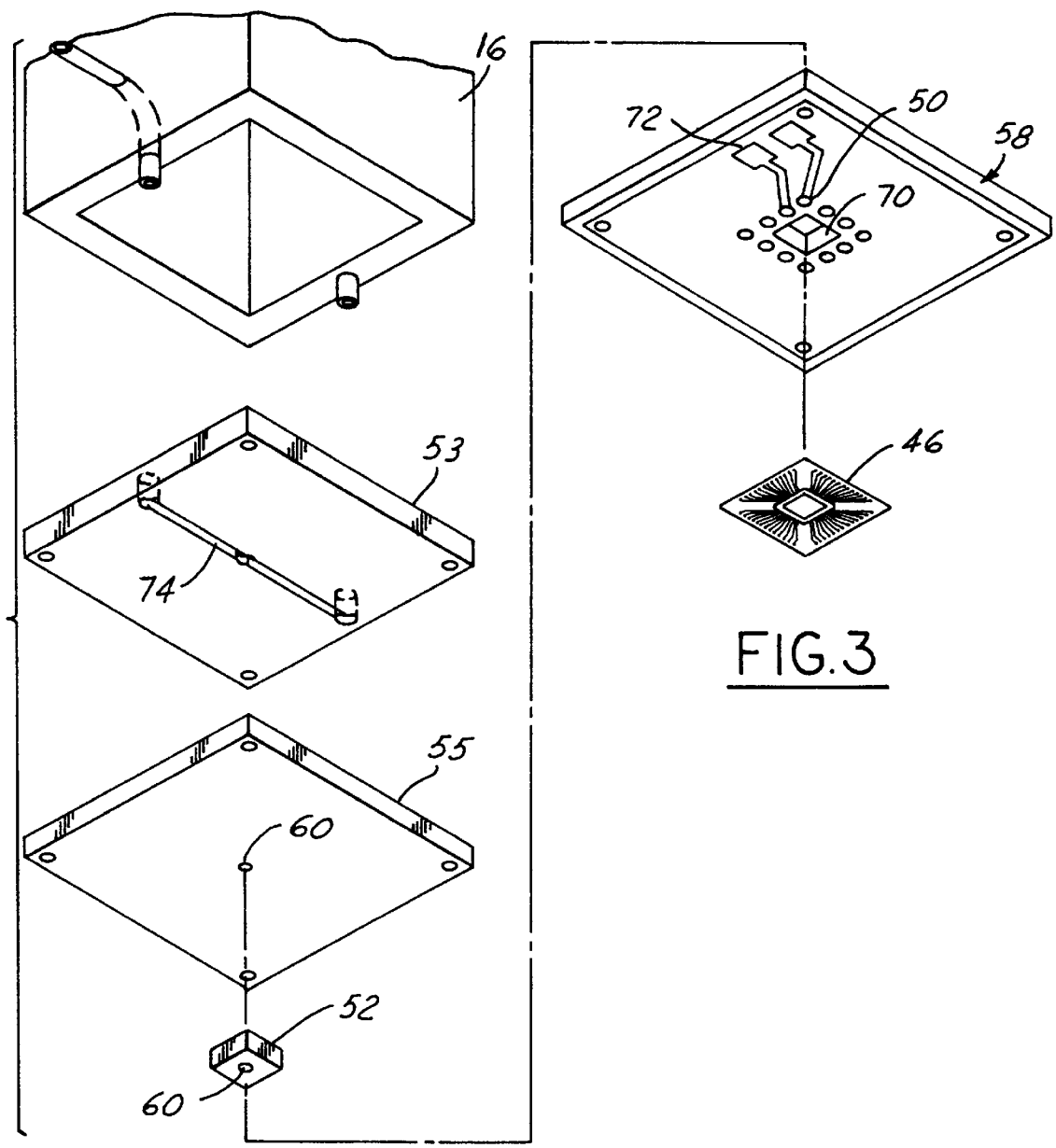
FIG. 3 is a perspective view of the test board.

Referring now to FIG. 3, an exploded view of the connection of the test board 58 is shown. The test board 58 is shown below the elastic block 52, the elastic insert 55 and the portion 53. The test board 58 is shown having an interior hole 70 that allows the elastic block 52 to be positioned. The elastic block 52 and the elastic insert 55 each having a hole 60 that allows a vacuum to be created on the die 24. The portion 53 provides a vacuum slot that creates the vacuum hole 60. The portion 53 allows for the CCD loading fixture 16 to be connected.

The test board 58 has a number of I/O pads 72 that create an electrical connection between the TAB tape 46 and the die 24. The I/O pads 72 provide a means for connecting the die to an external testing device (not shown). To test a particular die 24, the TAB tape 46 is specifically created to touch the individual portions of the die that need to be tested. The bumps 50 are positioned at the same portion of the test board 58 so that a single test board can be used with a variety of dies 24. However, a particular TAB tape 46 can be created to provide specific connections between the bumps 48 and the die 24. As a result, only the TAB tape 46 needs to be specifically manufactured for a particular die 24. This results in a cost savings by allowing the external testing device to use a single test board 58 to test a variety of dies 24.

Figure 4:
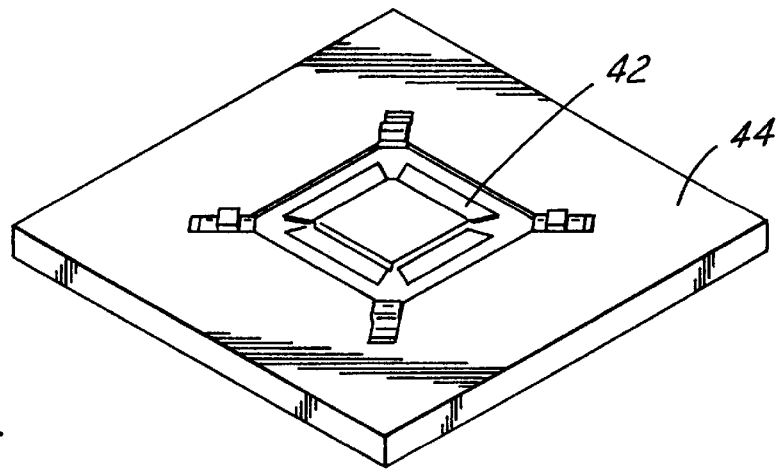
FIG. 4 is a perspective view of the spring-board mounting device.

Referring to FIG. 4, a more detailed view of the spring loaded locating block 42 is shown. The spring loaded locating block 42 is positioned in the heat sink material 44. As discussed in connection with FIG. 2, the spring loaded locating block 42 may be designed with a particular stiffness to allow the leadframe fingers 28 to make an appropriate connection with the test board 58. The connection should be firm enough to allow a solid electrical connection to be formed, but loose enough to prevent damage to any of the components of the device 10.

A major benefit made possible by the present invention method and apparatus is that the die 24 may be tested in a KGD (know good die) test or a KGS (know good substrate) test, if desired without permanently bonding the die 24. The separation of the die 24 from the leadframe and the subsequent testing of the die 24 can not be achieved by any of the conventional methods where heat sinks are permanently bonded to leadframes. Repairs on the die 24 can also be performed after testing if such repairs are necessary.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiment of the invention in which an exclusive property or privilege is claimed are defined as follows:

1. A test board for connecting a bare die to a leadframe for testing comprising:

a conducting surface on a bottom surface of said board for engaging with and electrically connecting to a lead finger on said leadframe, a tape automated bonding (TAB) tape having a conductive lead and a first and a second conductive bump, said first conductive bump being situated on an upper surface of said lead and said second conductive bump being situated on a bottom surface of said lead for establishing electrical communication between said bumps through said conductive lead, and said first bump being connected to the conducting surface on said board and said second bump engaging an input/output pad on said bare die for establishing electrical communication such that said bare die is tested through said leadframe.

2. A test board according to claim 1 wherein said TAB tape is specifically designed for a particular die.

3. A test board according to claim 1, wherein said lead finger on said leadframe further comprises a solder bump on a surface of the lead finger facing the test board.

4. A test board according to claim 1, wherein said lead finger is supported by a spring-loaded means.

5. A test board according to claim 1 further comprising an aperture.

6. A test board according to claim 1 further comprising a plurality of input/output pads.

7. A test board according to claim 1, wherein said bare die is mounted to a heat sink by temporary adhesive means.

8. A test board according to claim 7 wherein said temporary adhesive means comprises a thermoset polymer.

9. A test board according to claim 8 wherein said thermoset polymer is loaded with a conductive metal powder.

10. A test board according to claim 9 wherein said conductive metal powder is silver.

11. A method of testing a bare die comprising the steps of:

mounting the bare die on a heat sink by adhesive means, providing a test board having a conductive surface on a bottom side of the board for engaging with and electrically connecting to one of two solder bumps with one solder bump situated on each side of the lead, one of said bumps is connected to the conductive surface on said test board and the other bump for contacting and making electrical connection with an input/output pad on said bare die, and pressing said test board against said lead finger and said bare die such that said conductive surface on the test board contacts said lead finger and said other solder bump on a tape automated bonding tape contacts said input/output pad on said bare die so that testing on said die is conducted.

12. The method according to claim 11 further comprising the step of removing said bare die from said heat sink after testing.

13. The method according to claim 12 further comprising repeating said mounting step, said providing step, said pressing step and said removing step.

14. The method according to claim 11 further comprising the step of applying a vacuum force to said die.

15. The method according to claim 11 further comprising the step of performing a know good die (KND) test on said bare die.

16. An apparatus for testing a bare die comprising:

a leadframe holding plate for fixing a leadframe thereto such that lead fingers on said leadframe extend away from said leadframe, a test board holding fixture affixed to said leadframe holding plate for holding a test board and making X, Y and Z plane position adjustments of the board, a test board having a conducting surface on a bottom surface for engaging with and electrically connecting to lead fingers on said leadframe, a heat sink having a bare die mounted thereon by adhesive means and a peripheral region situated juxtaposed to said leadframe holding plate, a tape automated bonding (TAB) tape having a conductive lead and first and second solder bumps, said first bump is positioned on an upper surface of a lead and said second bump is positioned on a lower surface of the lead with an electrical connection established between said bumps, said first bump is connected to the conducting surface on the test board and said second bump is adapted to engage an I/O pad on said bare die for establishing electrical communication thereinbetween, and an optical means for engaging with said test board holding fixture for adjusting the position of said test board relative to said bare die.

17. An apparatus according to claim 16, wherein said heat sink further comprises a spring mounted locating block to support the lead fingers on said leadframe during testing.

18. The apparatus according to claim 16, further comprising mechanical adjustment means for adjusting said test board in response to a signal received from said optical means.

19. The apparatus according to claim 16, wherein said apparatus is used to perform a know good die (KGD) test.

20. The apparatus according to claim 16, wherein said apparatus is used to perform a test selected from the group consisting of a know good die (KGD) test, a know good set (KGS) test and know good module (KGM) test.

* * * * *